US008701511B2

(12) United States Patent
Oldrey et al.

(10) Patent No.: US 8,701,511 B2
(45) Date of Patent: Apr. 22, 2014

(54) INERT GAS DELIVERY SYSTEM FOR ELECTRICAL INSPECTION APPARATUS

(75) Inventors: Richard Walter Oldrey, Clintondale, NY (US); Terence Lawrence Kane, Wappinger Falls, NY (US); Michael Tenney, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 411 days.

(21) Appl. No.: 13/053,267

(22) Filed: Mar. 22, 2011

(65) Prior Publication Data

US 2012/0240657 A1 Sep. 27, 2012

(51) Int. Cl.
*G01N 21/15* (2006.01)

(52) U.S. Cl.
USPC .......... 73/864.91; 359/509; 356/244

(58) Field of Classification Search
USPC .......... 73/864.91; 359/509; 356/244
See application file for complete search history.

(56) References Cited

U.S. PATENT DOCUMENTS

| | | | |
|---|---|---|---|
| 4,364,630 A * | 12/1982 | Hayasaka | 359/379 |
| 4,757,255 A | 7/1988 | Margozzi | |
| 5,563,520 A | 10/1996 | Terada | |
| 5,654,546 A | 8/1997 | Lindsay | |
| 6,131,784 A * | 10/2000 | Helgesson et al. | 226/91 |
| 6,288,561 B1 | 9/2001 | Leedy | |
| 6,842,281 B2 * | 1/2005 | Tsurumune et al. | 359/368 |
| 6,906,543 B2 | 6/2005 | Lou et al. | |
| 6,943,347 B1 * | 9/2005 | Willoughby et al. | 250/288 |
| 7,005,880 B1 | 2/2006 | Buss et al. | |
| 7,072,103 B1 * | 7/2006 | Atchison | 359/384 |
| 7,723,980 B2 | 5/2010 | Johnson et al. | |

OTHER PUBLICATIONS

D.J. Sirbuly et al; Variable-ambient Scanning Stage for a Laser Scanning Confocal Microscope; Review of Scientific Instruments; vol. 74, No. 10, Oct. 2003, pp. 4366-4368.

* cited by examiner

*Primary Examiner* — Hezron E Williams
*Assistant Examiner* — Paul West
(74) *Attorney, Agent, or Firm* — Howard M. Cohn; Ian D. MacKinnon (57) ABSTRACT

An apparatus for electrical inspection is disclosed. The apparatus comprises an inert gas delivery system that delivers inert gas near a microscope imaging element and electrical test probes. A gas supply provides an inert gas such as argon or nitrogen. The inert gas displaces oxygen to prevent premature oxidation of the test probes. In one embodiment, one or more delivery tubes deliver inert gas to the measurement area.

10 Claims, 9 Drawing Sheets

INERT GAS DELIVERY SYSTEM FOR ELECTRICAL INSPECTION APPARATUS

FIELD OF THE INVENTION

The present invention relates generally to semiconductor test equipment, and more particularly to probing test equipment for electrical measurements.

BACKGROUND OF THE INVENTION

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. In testing, these conductive regions are commonly contacted with the probe needles of a probe card.

Therefore, it is desirable to have an improved apparatus and method for conducting tests with probes.

SUMMARY OF THE INVENTION

In one embodiment, an apparatus is provided. The apparatus comprises a microscope comprising an imaging element, a gas supply, a plurality of delivery tubes disposed proximal to the imaging element, and a gas supply conduit configured and disposed to deliver gas from the gas supply to the plurality of delivery tubes.

In another embodiment, an apparatus is provided which comprises a microscope comprising an imaging element, a gas supply, a shroud surrounding the imaging element such that a space for gas flow is formed between the shroud and the imaging element, and a gas supply conduit configured and disposed to deliver gas from the gas supply to the shroud.

In another embodiment, a method for calibrating an inspection apparatus is provided. The method comprises delivering inert gas to a delivery tube, recording a probe position, increasing the flow rate of the inert gas, recording the flow rate in response to detecting a change in position of the probe, and reducing the flow rate by a predetermined amount.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

DETAILED DESCRIPTION

Figure 1:
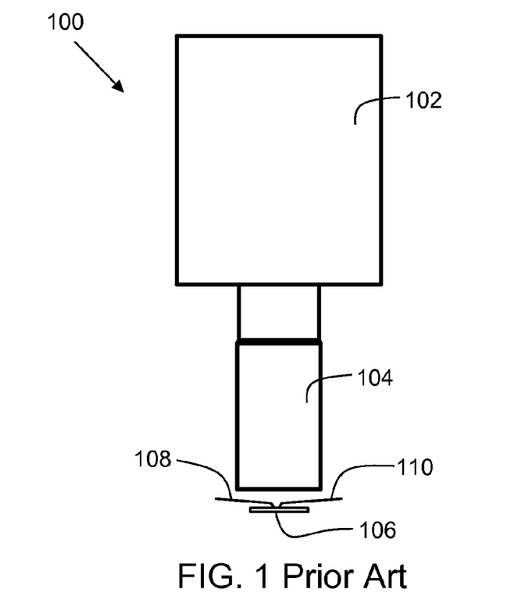
FIG. 1 shows a prior art inspection apparatus.

FIG. 1 shows a prior art inspection apparatus 100 which is briefly discussed here to provide some context for embodiments of the present invention. Inspection apparatus 100 comprises microscope body 102 and microscope lens 104. A device-under-test (DUT) 106 is typically a wafer, die, or other semiconductor circuit. Probes 108 and 110 are used to perform an electrical measurement on a particular area of the DUT. The tested area may comprise a metal pad, line, or via. Testable features, such as metal pads, lines and vias are conductors, and are often comprised of copper and/or aluminum. The probe tips (108, 110) are typically comprised of tungsten or other relatively hard metal and are also prone to a certain degree of oxidation. The probe tips and the testable features are quite small (on the order of micrometers), and hence, the microscope is used by an operator to assist in positioning the probe tips 110 on the desired feature of DUT 106.

As the probe tips 110 and DUT testable features are metal, they are vulnerable to the effects of oxidation. This may result in poor electrical contact with the probe tips, causing degraded measurement capability. In some instances, an environmentally sealed chamber (not shown) is used to surround the inspection apparatus 100 and device under test. An inert gas is then pumped into the chamber to displace ambient oxygen. While such a scheme reduces the effects of oxidation, it adds considerable cost to the inspection apparatus 100, and makes for a more complex and time-consuming test procedure due to the environmental chamber.

Figure 2:
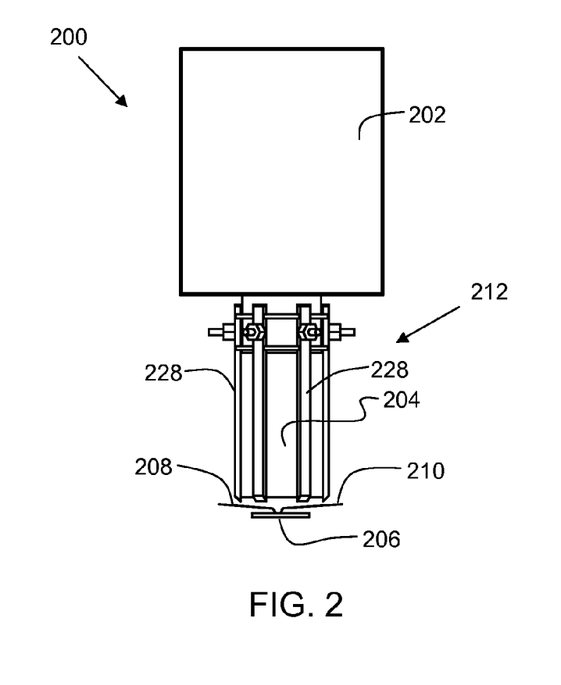
FIG. 2 shows an inspection apparatus in accordance with an embodiment of the present invention.

FIG. 2 shows an inspection apparatus 200 in accordance with an embodiment of the present invention. Inspection apparatus 200 comprises a microscope body 202, similar to apparatus 100 of FIG. 1. However, inspection apparatus 200 also comprises gas delivery system 212 which is affixed to the microscope imaging element 204. Gas delivery system 212 provides a steady flow of inert gas to DUT 206, which prevents oxidation of the DUT 206 or probe tips (shown as 208 and 210), without the need for an environmentally sealed chamber. Microscope imaging element 204 may be an optical element, such as a microscope objective (lens). The imaging element 204 may be used for coarse placement of the probes. The probe tips 208 and 210 may be atomic force probes. The atomic force probes operate by "feeling" the surface of a DUT with a mechanical probe. Piezoelectric elements that facilitate tiny but accurate and precise movements on (electronic) command enable the very precise scanning. In some variations, electric potentials can also be obtained using atomic force probes.

Gas delivery system 212 comprises a plurality of delivery tubes mounted on the microscope, proximal to the microscope imaging element 204. In one embodiment, the delivery tubes (indicated generally as 228) are mounted to a mounting ring which is oriented around the outer perimeter of microscope imaging element 204. Tubes 228 may be formed of a rigid material, such as brass or aluminum.

Figure 3:
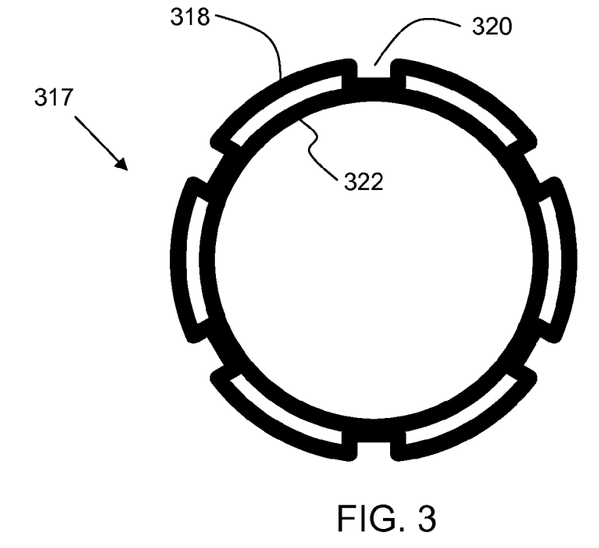
FIG. 3 shows a top view of a mounting ring.

FIG. 3 shows a top view of a mounting ring 317. Mounting ring 317 comprises an inner surface 322, and outer surface 318. Multiple insets 320 are formed in outer surface 318 to accommodate delivery tubes.

Figure 4A:
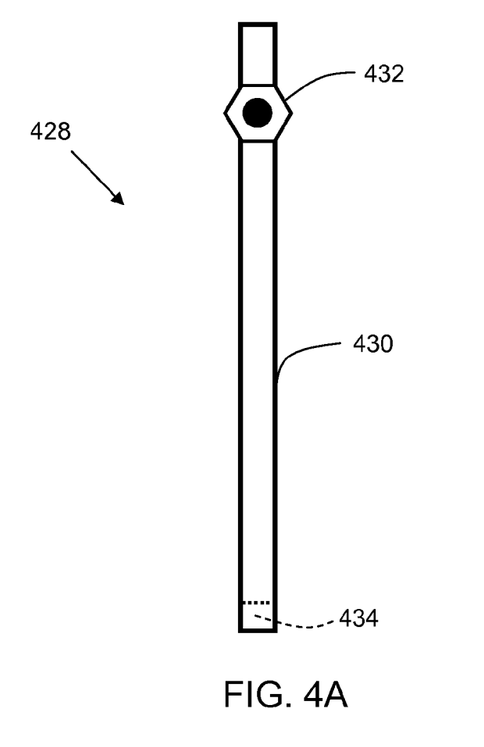
FIG. 4A shows a front view of a tube.
Figure 4B:
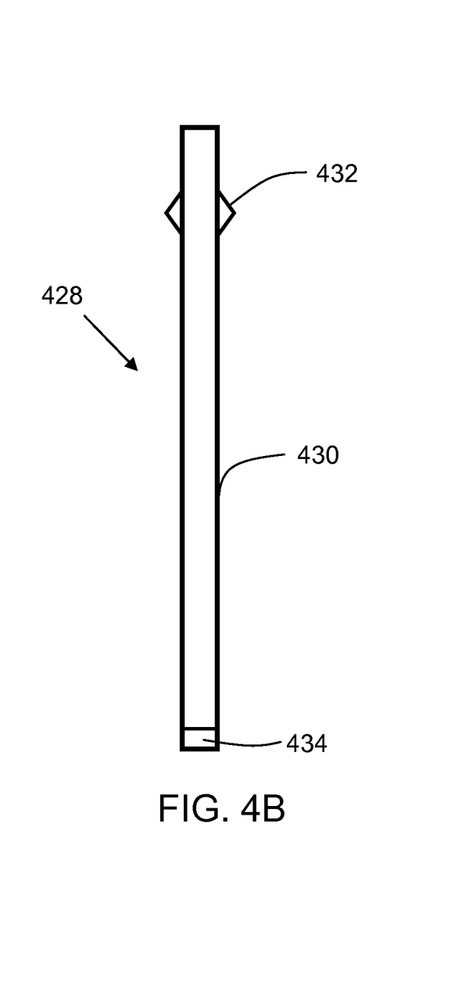
FIG. 4B shows a back view of a tube.
Figure 4C:
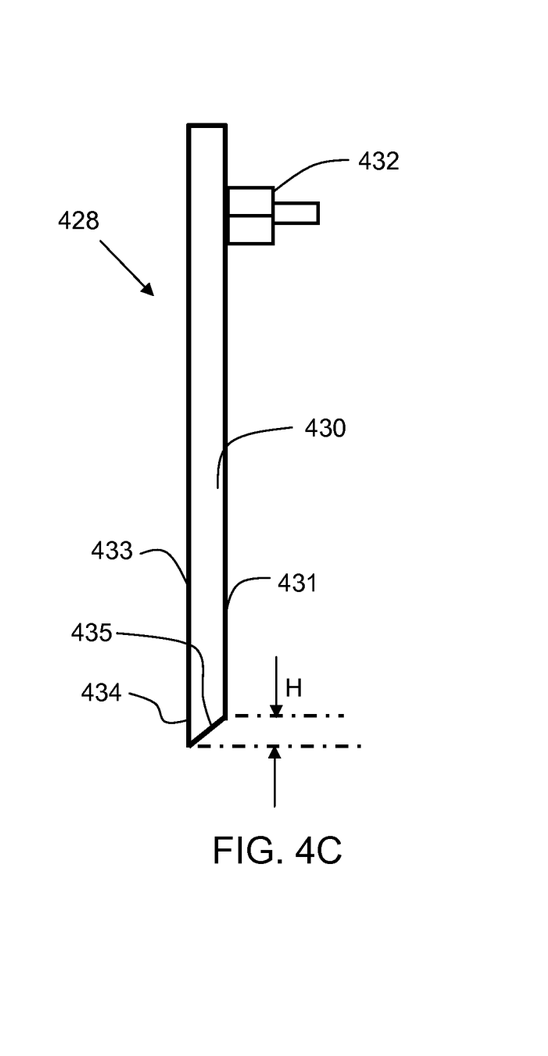
FIG. 4C shows a side view of a tube.
Figure 4D:
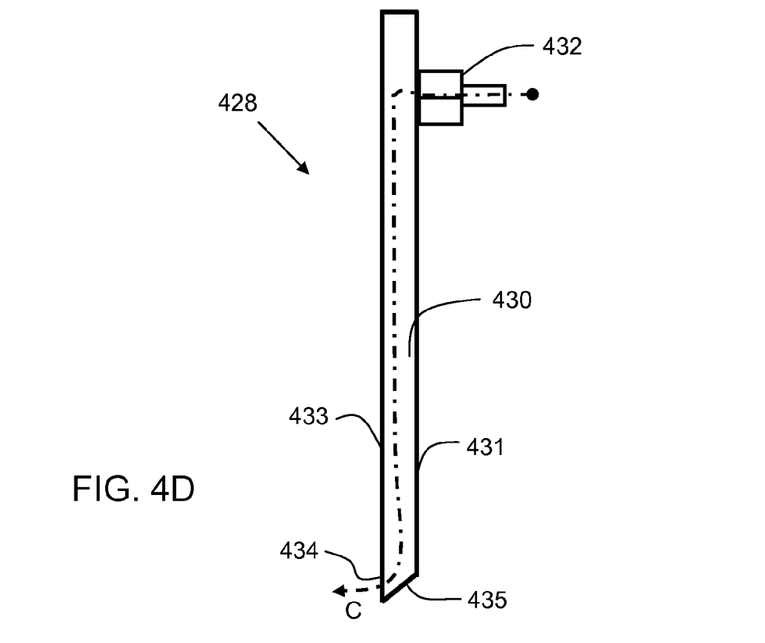
FIG. 4D shows a side view of a tube indicating gas flow.

FIG. 4A shows a front view of a delivery tube 428. Delivery tube 428 comprises elongated portion 430 and gas inlet port 432. FIG. 4B shows a back view of delivery tube 428 which shows gas outlet 434. FIG. 4C shows a side view of a delivery tube 428. As can be seen in this view, front wall 431, rear wall 433, and bottom edge 435 of delivery tube 428 is visible. The back wall 433 extends lower than front wall 431. Gas outlet 434 is disposed at the bottom of the back wall 433. In one embodiment, gas outlet 434 is a rectangular hole matching the width of the tube and the height H of the slanted bottom edge 435. The slanted bottom edge 435 directs gas inward toward the center of the imaging element of the microscope and the area being probed. The delivery tube 428 is of a rectangular cross-section. Other tube shapes, such as cylindrical delivery tubes, may also be used. FIG. 4D shows gas flow through tube 428. The gas flow, indicated by arrow "C" enters the tube 428 via gas inlet port 432, travels down elongated portion 430, and exits gas outlet 434. Slanted bottom edge 435 serves to direct gas out of the tube 428.

Figure 5A:
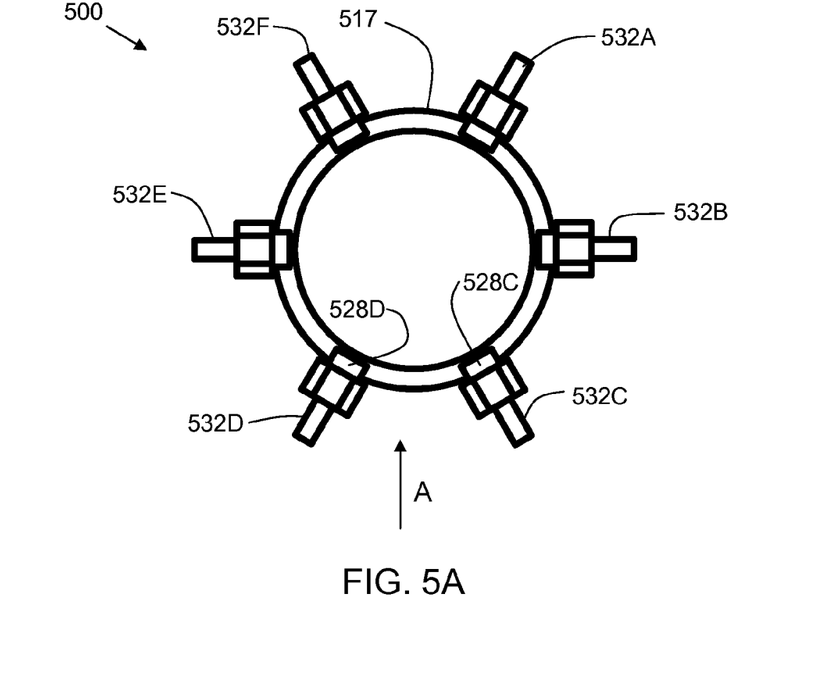
FIG. 5A shows a top view of a tube assembly.
Figure 5B:
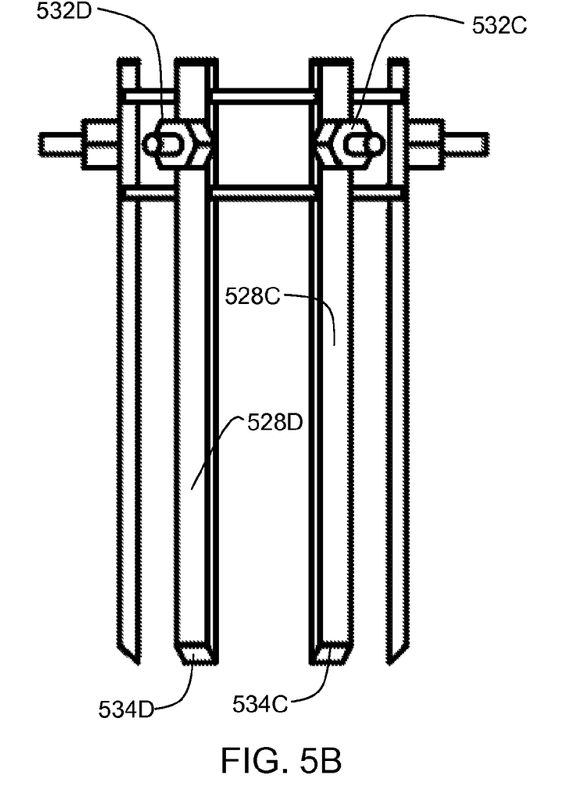
FIG. 5B shows a side view of a tube assembly.

FIG. 5A and FIG. 5B show a tube assembly 500. FIG. 5A shows a top view of tube assembly 500. Tube assembly 500 comprises mounting ring 517, and a plurality of delivery tubes (for clarity, only delivery tubes 528C and 528D are marked). Each delivery tube has a corresponding gas inlet port (532A-532F). FIG. 5B shows a side view of tube assembly 500, showing individual delivery tubes (for clarity, only delivery tubes 528C and 528D are marked) as viewed from direction A of FIG. 5A. Each delivery tube has a corresponding gas inlet port (for clarity, only inlet ports 532C and 532D are marked). Each delivery tube has a corresponding gas outlet (for clarity, only outlets 534C and 534D are marked). Tube assembly 500 can contain up to six probes. In practice, embodiments may comprise more or fewer tubes. In one embodiment, there is a delivery tube for each probe used, but the number of tubes may be less than or greater than the number of probes in use.

Figure 6A:
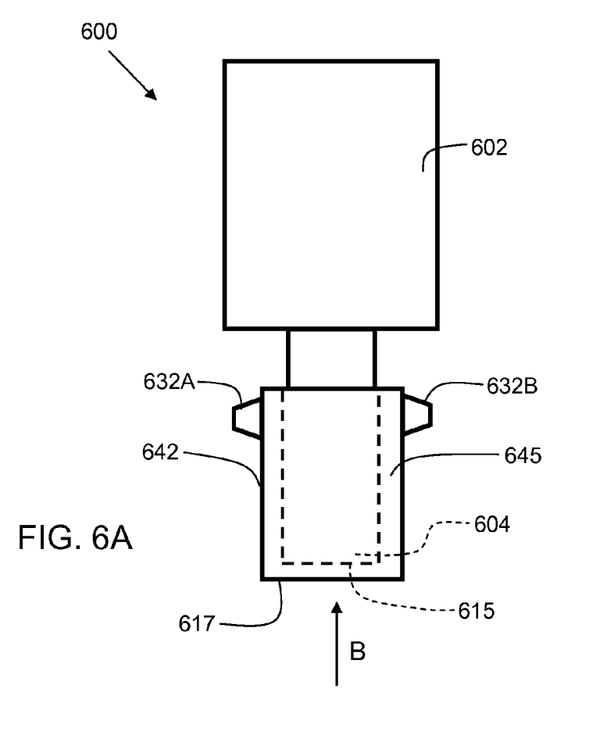
FIG. 6A shows a side view of an alternative embodiment of the present invention.
Figure 6B:
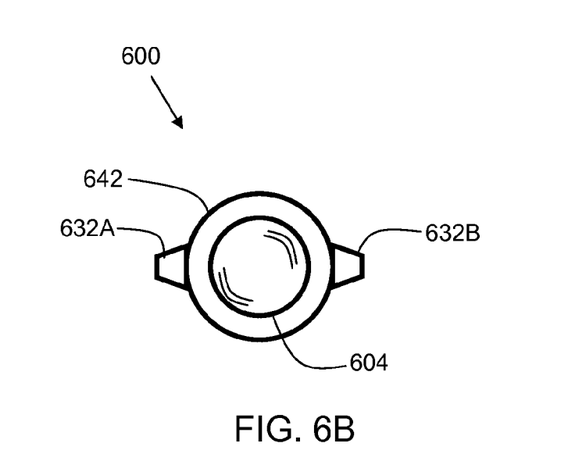
FIG. 6B shows a bottom-up view of the embodiment of FIG. 6A.

FIG. 6A and FIG. 6B show an inspection apparatus 600 in accordance with an alternative embodiment of the present invention. FIG. 6A shows a side view of inspection apparatus 600. In this embodiment, individual delivery tubes are not used. Instead, a shroud 642 is disposed such that it surrounds the microscope imaging element 604. The shroud 642 is sized larger than the imaging element 604 such that a space 645 exists between the shroud 642 and the imaging element 604, which accommodates a flowing inert gas. Hence, the shroud serves as a single, large delivery tube that has the imaging element inside of it. In one embodiment, the bottom edge 617 of shroud 642 extends below the bottom edge 615 of imaging element 604, such that the inert gas flows inward toward the center of the imaging element 604. Shroud 642 comprises one or more gas inlet ports (shown as 632A and 632B). FIG. 6B shows a bottom-up view of the inspection apparatus 600 of FIG. 6A (as viewed from direction B of FIG. 6A), showing shroud 642 surrounding microscope imaging element 604.

Figure 6C:
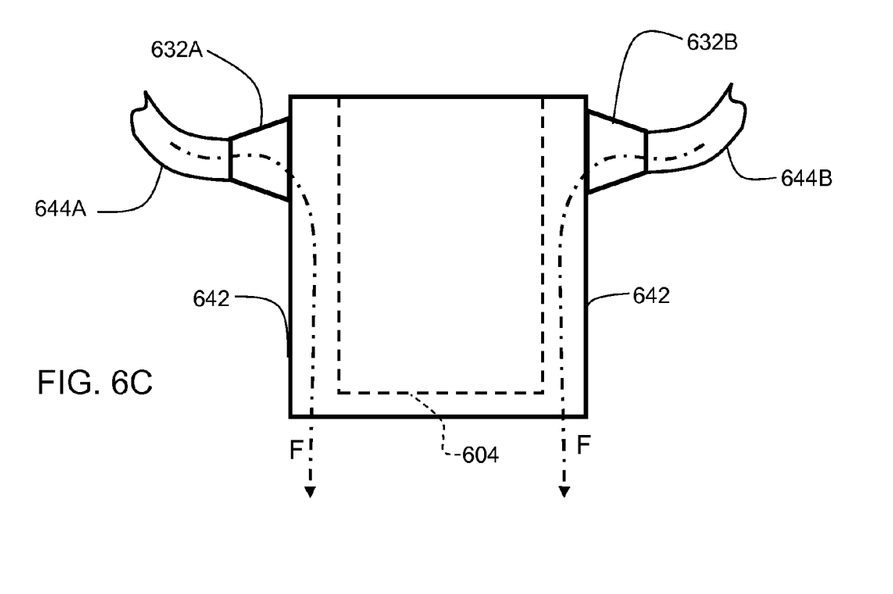
FIG. 6C shows a detailed view indicating gas flow in the embodiment of FIG. 6A.

FIG. 6C shows a detailed view indicating gas flow in the embodiment shown in FIG. 6A. Gas flow is indicated by arrows labeled "F." As indicated by those arrows, an inert gas flows through gas supply conduits 644A and 644B, into respective inlet ports 632A and 632B. Inert gas then flows downward between the shroud 642 and microscope imaging element 604.

Figure 7:
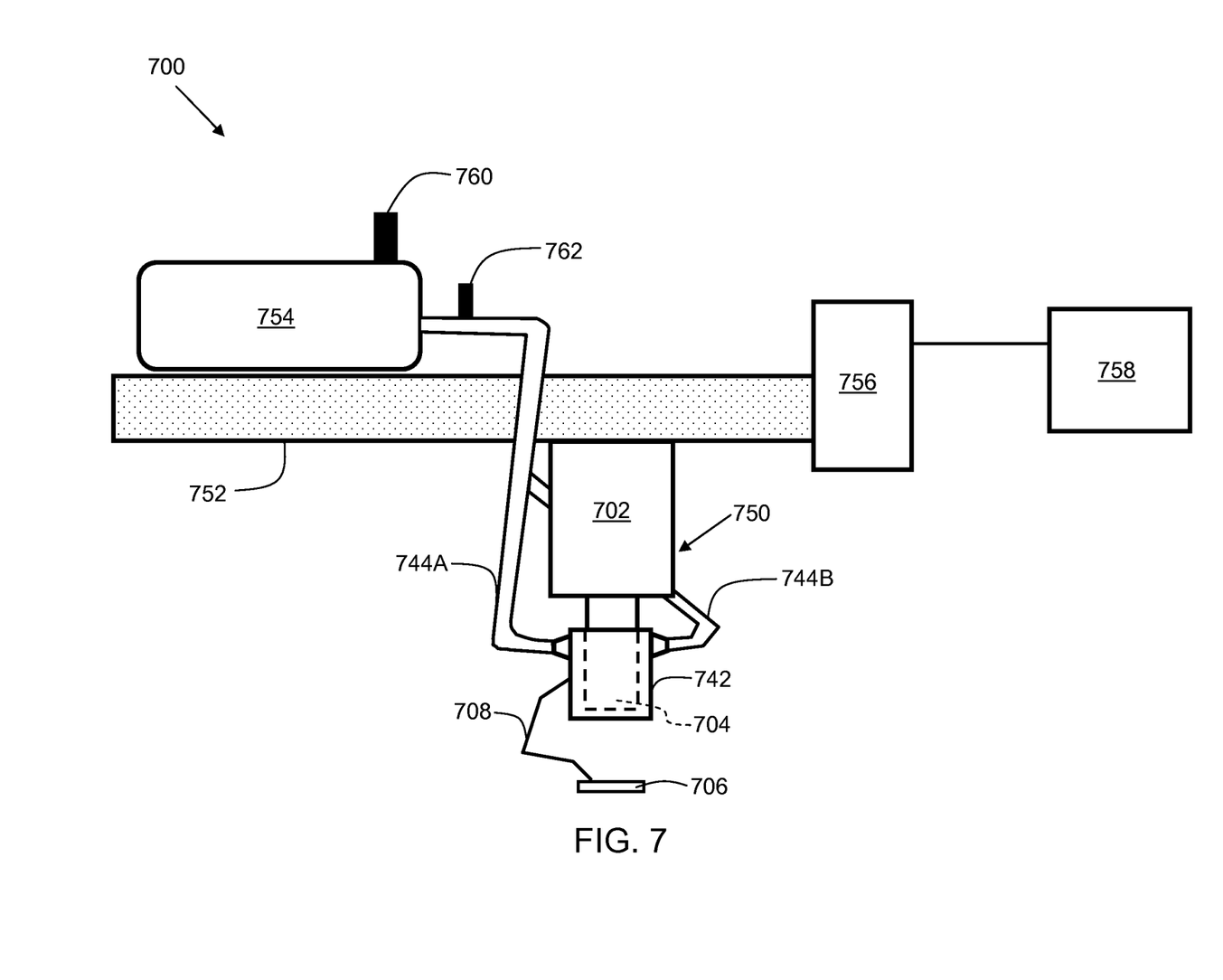
FIG. 7 shows a system block diagram in accordance with an embodiment of the present invention.

FIG. 7 shows a block diagram of an inspection system 700 in accordance with an embodiment of the present invention. Inspection system 700 comprises inspection apparatus 750, which may be similar to inspection apparatus 600 or inspection apparatus 200 as described previously. Inspection apparatus 750 comprises microscope imaging element 704. In the embodiment shown, shroud 742 directs inert gas downward to prevent oxidation of DUT 706 and probe 708. Note that in this example, inspection apparatus 750 comprises a shroud, similar to embodiment 600. However, it is also possible to use an inspection apparatus comprising delivery tubes, such as that described with inspection apparatus 200. Microscope body 702 of inspection apparatus 750 is mounted to a gantry 752 and is movable by electric motor 756. Electric motor 756 is controlled by computer 758 to allow precise positioning of inspection apparatus 750. Inert gas supply 754 comprises control valve 760 to control the flow of dry inert gas. In one embodiment, inert gas supply 754 contains argon gas. In another embodiment, nitrogen gas is used. In one embodiment, control valve 760 is controllable via computer 758. Optionally, flow meter 762 may be used to monitor the flow of inert gas via computer 758. If the flow rate is too low, then oxygen is not sufficiently displaced from the device-under-test and probes, and oxidation could occur. If the flow rate is too high, the probes could be moved by the flow of the gas, potentially disrupting the measurement. The inspection system 700 may be calibrated by adjusting the flow to a level where probes are being moved by the flow of gas, and then reduce the rate by a predetermined amount (e.g. 10-15 percent). This movement may be confirmed optically, or by performing a series of measurements as gas flow is increased, noting a fluctuation due to excessive movement. By reducing the flow from the point where probe movement was detected, the flow rate is near the highest possible rate which does not cause any stability problems with the probes. The flow rate used depends on the specifics of the delivery system, such as the number of tubes, and the diameter of the tubes. However, once the operating flow rate for a particular configuration is empirically determined, that flow rate value can be set by utilizing the control valve 760 and flow meter 762.

Figure 8:
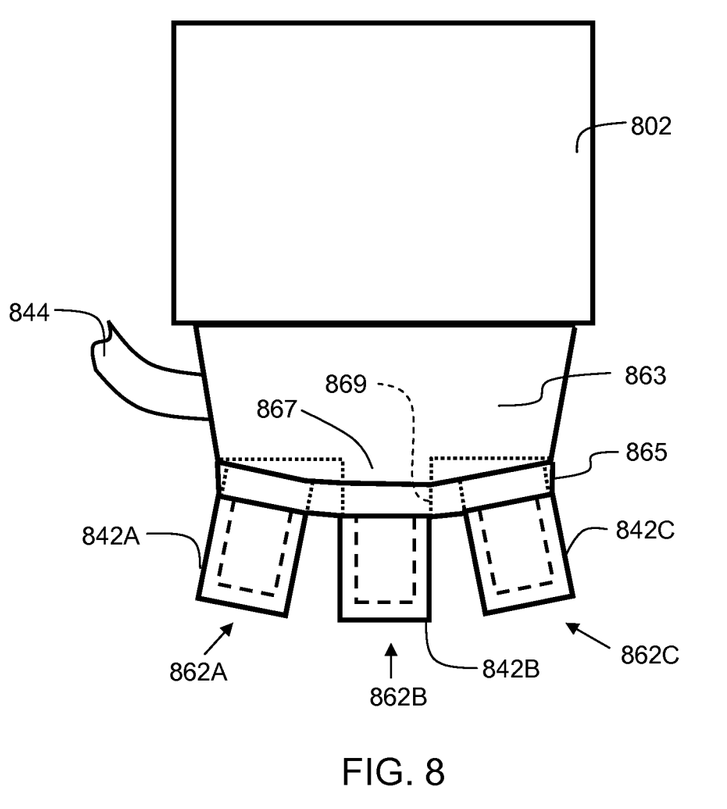
FIG. 8 shows another alternative embodiment of the present invention.

FIG. 8 shows another alternative embodiment of the present invention, for use with a turret microscope system. In this embodiment, microscope body 802 is optically connected to a plurality of optical microscope objectives (862A, 862B, and 862C) disposed in a turret 865. Turret 865 is moveable to allow selection of a particular microscope objective. As shown in FIG. 8, objective 862B is selected. Gas supply conduit 844 provides gas to manifold 863, which directs the gas to the selected objective (862B). The turret comprises a passageway 869 for each objective. The manifold 863 comprises a passageway 867 over the selected objective, such that gas flows from the manifold to the delivery system of the selected objective (862B). Note that in this example, each objective (862A, 862B, and 862C) comprises a shroud (842A, 842B, 842C), similar to embodiment 600. However, it is also possible to use an inspection apparatus comprising delivery tubes, such as that described with inspection apparatus 200.

Figure 9:
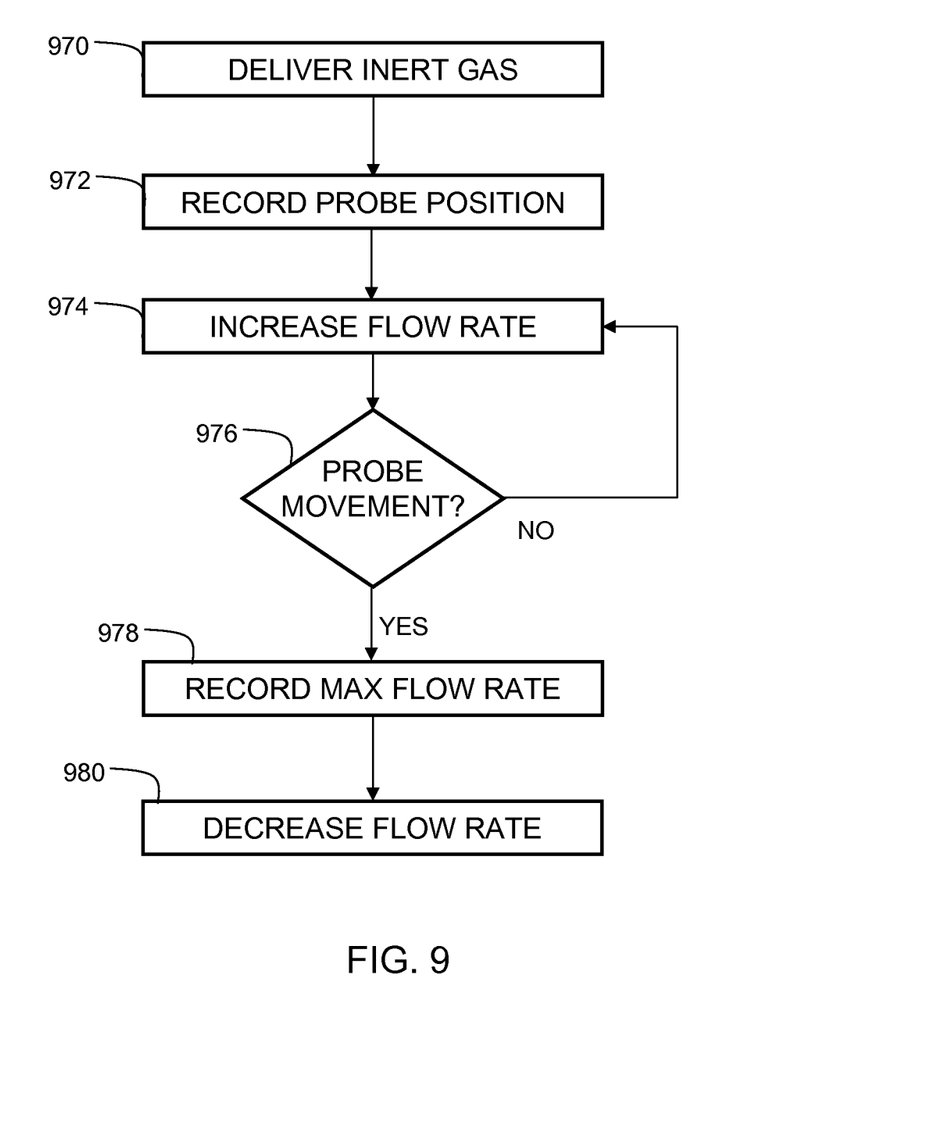
FIG. 9 is a flowchart indicating method steps for calibrating embodiments of the present invention.

FIG. 9 is a flowchart indicating method steps for calibrating embodiments of the present invention. In process step 970, an inert gas is delivered to delivery tubes (or a shroud). In process step 972, the position of a measurement probe is recorded. In process step 974, the flow rate of the inert gas is gradually increased. In process step 976, a check is made to see if a change in position of the probe has occurred due to the flow of inert gas. If the probe is not moving, the process returns to step 974 and the flow rate continues to increase. When the check at process step 976 indicates that the probe has moved, the maximum flow rate is recorded in process step 978. In process step 980, the flow rate is decreased by a predetermined amount (e.g. 10 to 15 percent) to avoid movement of probes, while still providing sufficient inert gas flow to displace oxygen and avoid oxidation of the probes. The recording of step 978 and control of the flow rate of inert gas may be performed with a computer (such as 758 of FIG. 7).

As can now be appreciated, embodiments of the present invention provide a gas delivery system that allows measurements of semiconductor features to be performed while mitigating the adverse effects of oxidation, and eliminates time and cost associated with an environmentally sealed chamber.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. An apparatus, comprising:
   a microscope comprising an imaging element;
   a gas supply;
   a plurality of delivery tubes disposed proximal to the imaging element;
   a gas supply conduit configured and disposed to deliver gas from the gas supply to the plurality of delivery tubes; and
   a mounting ring, said mounting ring comprising an inner surface and an outer surface, wherein a plurality of insets are formed in the outer surface, and wherein each of the plurality of insets is configured and disposed to accommodate one of the plurality of delivery tubes, and wherein the inner surface surrounds the imaging element.

2. The apparatus of claim 1, wherein the plurality of delivery tubes comprises rectangular tubes.

3. The apparatus of claim 2, wherein each of the plurality of delivery tubes comprises:
   a front wall;
   a back wall comprising a gas outlet; and a slanted bottom edge, such that the back wall extends lower than the front wall.

4. The apparatus of claim 3, wherein the gas outlet has a height equal to the height of the slanted bottom edge.

5. The apparatus of claim 1, wherein the plurality of delivery tubes is comprised of brass.

6. The apparatus of claim 1, wherein the plurality of delivery tubes is comprised of aluminum.

7. The apparatus of claim 1, further comprising a control valve configured and disposed to control gas flow rate from the gas supply.

8. The apparatus of claim 7, further comprising a flow meter configured and disposed to indicate gas flow rate within the gas supply conduit.

9. The apparatus of claim 7, further comprising:
   a plurality of imaging elements disposed in a turret;
   a manifold disposed above the turret;
   wherein the gas supply conduit is connected to the manifold, and the manifold is configured and disposed to deliver gas to at least one of the plurality of imaging elements disposed in the turret.

10. The apparatus of claim 1, wherein the imaging element is an optical imaging element.

* * * * *